United States Patent [19]
Moustakas

[11] Patent Number: 5,296,119
[45] Date of Patent: Mar. 22, 1994

[54] DEFECT-INDUCED CONTROL OF THE STRUCTURE OF BORON NITRIDE

[75] Inventor: Theodore D. Moustakas, Dover, Mass.

[73] Assignee: Trustees of Boston University, Boston, Mass.

[21] Appl. No.: 833,628

[22] Filed: Feb. 7, 1992

Related U.S. Application Data

[63] Continuation of Ser. No. 614,994, Nov. 26, 1990, abandoned.

[51] Int. Cl.$^5$ .............................................. C23C 14/34
[52] U.S. Cl. ........................... 204/192.15; 204/192.16
[58] Field of Search .............. 204/164, 192.15, 192.16; 427/523, 569, 590, 248.1, 255.2

[56] References Cited

U.S. PATENT DOCUMENTS

| | | | |
|---|---|---|---|
| 4,412,899 | 11/1983 | Beale ................................ | 204/192.11 |
| 4,656,052 | 4/1987 | Satoo et al. ............................ | 427/38 |
| 4,683,043 | 7/1987 | Melton et al. .................... | 204/192.15 |
| 4,941,430 | 7/1990 | Watanabe et al. .................... | 118/723 |

OTHER PUBLICATIONS

M. D. Wiggins et al, *J. Vac. Sci. Technol.*, vol. A2(2), Apr.-Jun. 1984, pp. 322-325.

*Primary Examiner*—Aaron Weisstuch
*Attorney, Agent, or Firm*—Choate, Hall & Stewart

[57] ABSTRACT

A method of controlling defects in boron nitride films in order to stabilize certain crystallographic structures is disclosed. Such defects include, for example, nitrogen vacancies, boron interstitials, and substitutional dopants. In particular, films produced by the method of sputtering in pure inert gas atmospheres have a tetrahedrally coordinated structure and are rich in nitrogen vacancies. Films produced by the same method in inert gas with a sufficient nitrogen overpressure have a completely stoichiometric graphitic structure. These results are expected for any defect type having a greater free energy of formation in the graphitic form of boron nitride than in the tetrahedral forms. The methods of the invention are applicable to any film growth technique capable of incorporating such defects.

12 Claims, 6 Drawing Sheets

DEFECT-INDUCED CONTROL OF THE STRUCTURE OF BORON NITRIDE

This is a continuation of copending application Ser. No. 07/614,994 filed on Nov. 26, 1990, now abandoned.

BACKGROUND OF THE INVENTION

This invention relates to methods for controlling the structure of boron nitride thin films through the introduction during film growth of certain crystallographic defects.

Bulk boron nitride exists in three crystallographic modifications:
a) the hexagonal graphite structure
b) the cubic zincblende structure
c) the hexagonal wurtzite structure The hexagonal graphitic structure is the thermodynamically stable phase with a hexagonal bonding exactly analogous to graphite. Because of the weak forces between the hexagonal planes this material can be used as a solid state lubricant.

The cubic and the wurtzitic structures are metastable phases which do not exist in nature. In the laboratory they have been synthesized by high pressure methods. The cubic structure has been formed by applying high static pressure (40,000-60,000 atmospheres) at relatively high temperatures (1400°-1700° C.) in the presence of solvent catalysts (alkali metals, alkaline earth metals, and their nitrides and borides). The wurtzitic structure has been formed by high pressure shock wave methods. These high pressure methods lead to the formation of powders, which subsequently are sintered under high pressure conditions to produce bulk materials for grinding and cutting applications.

The bonding in the cubic and wurtzitic structure is tetrahedral and the symmetry of this bond makes these two structures the second hardest materials in nature after diamond. The cubic and the wurtzitic structures have cubic and hexagonal symmetries because the identical planes of atoms in the two structures repeat themselves with a sequence ABC—ABC—ABC . . . and AB—AB—AB . . . respectively. However, the hardness of the two structures is identical since it is determined by the tetrahedral coordination, rather than by the crystallographic symmetry.

Boron nitride thin films have been grown by low pressure and temperature methods. The majority of these methods, including chemical vapor deposition and plasma enhanced chemical vapor deposition, lead to graphitic or amorphous boron nitride. Other methods, including reactive evaporation, ion beam implantation, reactive pulse plasma deposition and ion beam extraction have led to the deposition of the tetrahedral coordinated boron nitride compounds. In these methods, the film is deposited from ionic boron and nitrogen containing species.

SUMMARY OF THE INVENTION

One aspect of the invention is a method for depositing a boron nitride film having a selected defect concentration and crystallographic structure on a substrate by controllably introducing crystallographic defects during film growth. It has been discovered that defect-free boron nitride films crystallize in the graphitic forms, while those with certain concentrations of one or a combination of defect types having greater free energy of formation in the graphitic form than in the tetrahedral forms crystallize in the tetrahedral forms. Such defects include, for example, nitrogen vacancies, boron interstitials, and substitutional dopants. The method of the present invention can be used to deposit hard, stable films having a tetrahedrally coordinated crystal structure or lubricious, less stable films having a graphitic crystal structure.

In a particular embodiment, a radio frequency (RF) sputtering technique is used to deposit the boron nitride films. Other appropriate depositing techniques include chemical vapor deposition, plasma enhanced chemical vapor deposition, reactive evaporation, ion beam implantation, reactive pulse plasma deposition, and ion beam extraction.

A particular aspect of the invention is a method for depositing a boron nitride film on a substrate by growing the film using a reactive RF sputtering technique in a mixed inert gas/nitrogen atmosphere wherein the inert gas/nitrogen ratio is selected to yield a selected defect concentration and crystal structure. Films sputtered according to the method of the invention in a pure inert atmosphere have a tetrahedrally coordinated crystal structure that is either cubic, wurtzite, or a mixture of cubic and wurtzite, with nitrogen vacancies in the range of 10-40%. Such films have a hardness of at least 3500 kg/mm$^2$ and are stable under atmospheric conditions. The defect concentration improves the toughness of the film. Films sputtered according to the method of the invention in an atmosphere including 10-50% N$_2$ have a completely stoichiometric graphitic crystal structure which is not stable under atmospheric conditions. Such film have some lubricant properties.

In embodiments of the method, the substrate temperature is selected to control the degree of disorder in the deposited film and film stability. For a low degree of disorder, substrate temperatures in the range 400°-600° C. are preferred.

In further embodiments of the method, the substrate is biased to improve film adhesion and facilitate crystallization. Appropriate biasing methods include RF biasing and induced biasing.

Another aspect of the invention is a boron nitride film deposited according to the methods of the invention wherein the ratio of the flux of nitrogen to the flux of boron to the substrate is less than or equal to one, preventing deposition of stoichiometric boron nitride. In one embodiment, the film is grown by the method of sputtering in a pure inert atmosphere resulting in 10-40% nitrogen vacancies in the crystal structure. The film is useful as an abrasion resistant coating for hardening stainless steel tools and other substrates.

DESCRIPTION OF THE PREFERRED EMBODIMENT

Figure 1:
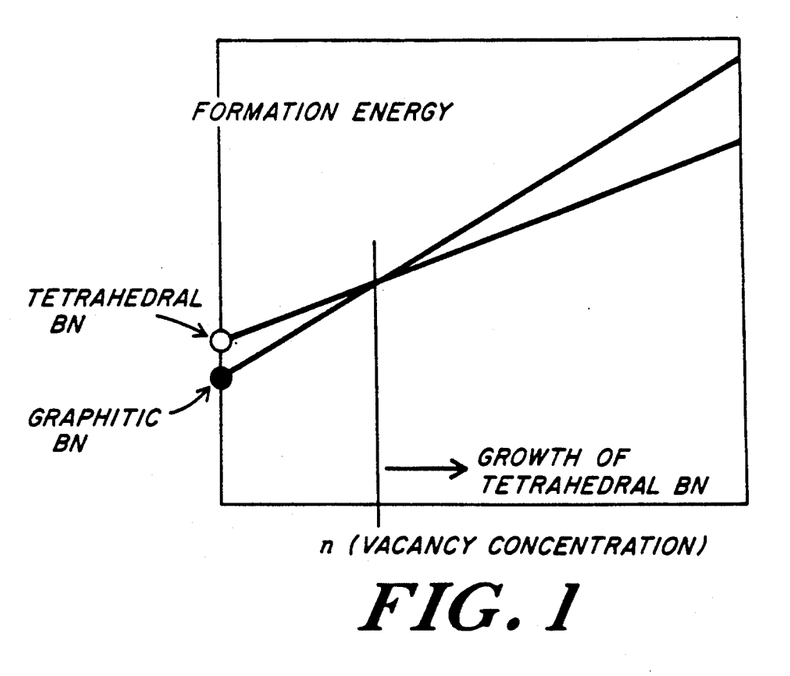
FIG. 1 is a graph showing the energy of formation of graphitic and tetrahedrally coordinated boron nitride.

In defect-free boron nitride, the free energy of formation of the graphitic form is smaller than the free energy of formation of its tetrahedral forms. This is the reason why the graphitic boron nitride is thermodynamically stable over its tetrahedral counterparts. In boron nitride with defects, the free energy of formation increases by the energy required to form the defects. For example, if n vacancies are introduced, the free energies of the graphitic form ($F^G$) and of the tetrahedral forms ($F^T$) are given by the expressions $$F^G = F_b^G + nF_v^G \quad (1)$$

$$F^T = F_b^T + nF_v^T \quad (2)$$

where the $F_b$'s are the free energies in the fully-bonded (defect-free) structures and the $F_v$'s are the energy of formation of one vacancy in these structures. According to these equations, the free energy of both structures increases linearly with the concentration of defects, as illustrated in FIG. 1. The intercept of these lines is $F_b$ and the slope of the lines is $F_v$. If $F_v^G > F_v^T$, then the two lines will cross at a certain concentration $\gamma$ of defects. For a vacancy concentration less than $\gamma$, the graphitic boron nitride is the thermodynamically stable phase, and for a vacancy concentration greater than $\gamma$, the tetrahedral forms of boron nitride are the thermodynamically stable phases.

Equations 1 and 2 are valid for any defect which can be formed in both the graphitic and the tetrahedral forms of boron nitride. However, only those defects with larger energy of formation in the graphitic than in the tetrahedral forms will cause the crossing indicated in FIG. 1 and the thermodynamic reversal in the stability of the two structures. Since there are no calculations of the energy of formation of defects in the various structures of boron nitride, one has to establish empirically for which defects $F_D^G > F_D^T$.

Boron nitride is a III-V compound, and thus, the kinetics of film growth resembles that of other III-V compounds. It is well known that in these materials the sticking coefficient of the group III element to the substrate is equal to one, while the sticking coefficient of the group V element is less than one, since it adheres only if there is a group III site available to bond to. Thus, in general, in order to grow stoichiometric III-V compounds from the vapor phase, one usually chooses the ratio of the fluxes of group V to group III elements to be much larger than one.

In analogy, during the growth of boron nitride by sputtering from a hexagonal boron nitride target in pure argon, the boron nitride films are expected to be deficient in nitrogen and thus, rich in nitrogen vacancies, while those produced in a nitrogen overpressure are expected to be stoichiometric. In other methods of growing boron nitride films, nitrogen vacancies can be formed by having equal fluxes of boron and nitrogen arriving at the substrate at any time, and stoichiometric films can be formed by having a nitrogen overpressure.

The incorporation and control of defects in boron nitride films depend on the method of film growth. However, since in all methods the film growth temperature is relatively low with respect to the melting point of boron nitride, the defects are kinetically controlled by adjusting the sticking coefficient of the constituent and dopant elements.

As described further below, it has been discovered that boron nitride films produced in pure argon (rich in nitrogen vacancies) have a tetrahedral structure, while those produce in a nitrogen overpressure (stoichiometric films) have a graphitic structure. Thus, it can be inferred that $F_v^G > F_v^T$.

Dopants in semiconductors and insulators are also defects to which equations 1 and 2 and FIG. 1 apply. Thus, dopant impurities can also cause thermodynamic reversal in the stability of the graphitic and the tetrahedral phases of boron nitride.

Since boron nitride is III-V compound, there are three groups of dopants. Group VIA elements (O, Se, S, Te, etc.) can substitute the group VA element and act as donors. Group IIA elements (Be, Zn, Cd, etc.) can substitute group IIIA elements and act as acceptors. Group IVA elements (C, Si, Ge, Sn, Sb) can substitute either group IIIA or group VA elements and act as donors or acceptors respectively. Certain concentrations of such impurities can control the structure of boron nitride without the existence of nitrogen vacancies.

Boron nitride films have been grown according to the methods of the present invention using a commercial reactive radio frequency (RF) diode sputtering system. As will be appreciated by those skilled in the art, other methods of thin film growth are capable of incorporating the aforementioned defects. Thus, embodiments based on chemical vapor deposition, plasma enhanced chemical vapor deposition, reactive evaporation, ion beam implantation, reactive pulse plasma deposition and ion beam extraction, for example, are also within the scope of the invention.

Figure 2:
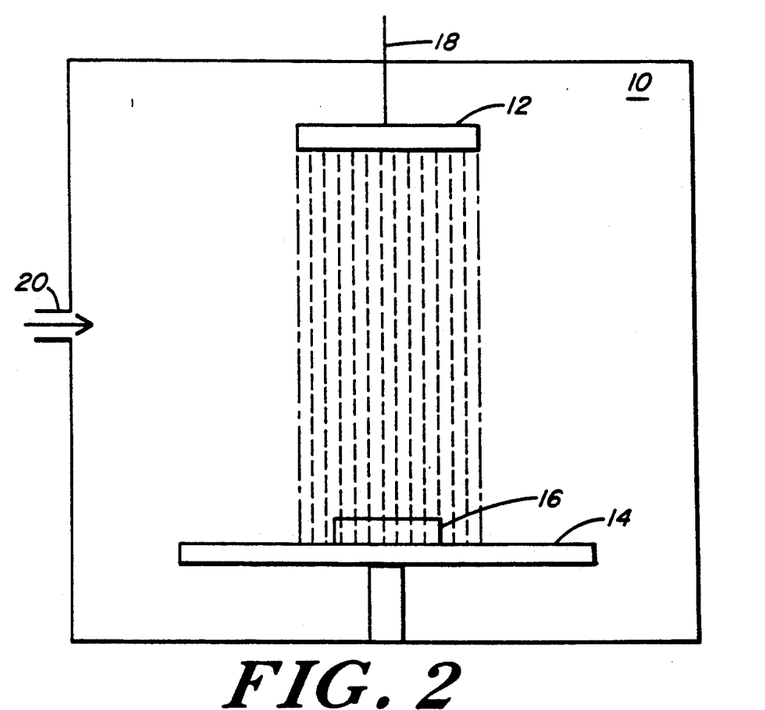
FIG. 2 is a schematic drawing of one embodiment of sputtering apparatus for growth of boron nitride films according to the invention.

One embodiment of apparatus for growing boron nitride on a substrate according to the invention is the sputtering apparatus illustrated in FIG. 2. As indicated, a vacuum chamber 10 encloses a target 12, a substrate table 14, and a substrate 16. Electrical power is delivered to the target 12 via electrical connection 18. One or more inlets 20 is provided for inputting gas to the chamber. The target is preferably graphitic boron nitride prepared by conventional ceramic processes. In some embodiments, the substrate table 14 is heated. In still other embodiments, means for applying or inducing a bias potential in the substrate are provided, as described further below.

According to the invention, gases are input to the chamber at low pressure for sputtering. In certain embodiments, an inert gas atmosphere is used. Argon, neon, helium, and krypton are suitable. Argon at about 2-10 mTorr has been found appropriate for some embodiments. In other embodiments, a mixture of an inert gas or gases and nitrogen is used. Nitrogen at 0.2-5 mTorr in argon is appropriate for some embodiments, as described further below.

The electrical power delivered to the target is at radio frequency. The power creates an argon plasma between the target and the substrate. On average, the target will have a negative potential due to the different mobilities of the ions and electrons in the argon plasma. This D.C. component may be on the order of 1-5 kilovolts. Argon ions hitting the target dislodge atoms which fall onto the substrate.

The most important materials property for determining the engineering application of a boron nitride film is the crystal structure of the film, with tetrahedrally coordinated films yielding hard, abrasion resistant films, and graphitic boron nitride yielding soft lubricating films. It has been discovered that using the method of the invention, the crystal structure of the film can be controlled by the sputtering atmosphere. Experiments have shown that when boron nitride films are sputtered in a pure argon atmosphere, the films have tetrahedral coordination. When sputtered in a mixed argon/nitrogen atmosphere having at least 10% nitrogen, the films exhibit graphitic structure.

Figure 3:
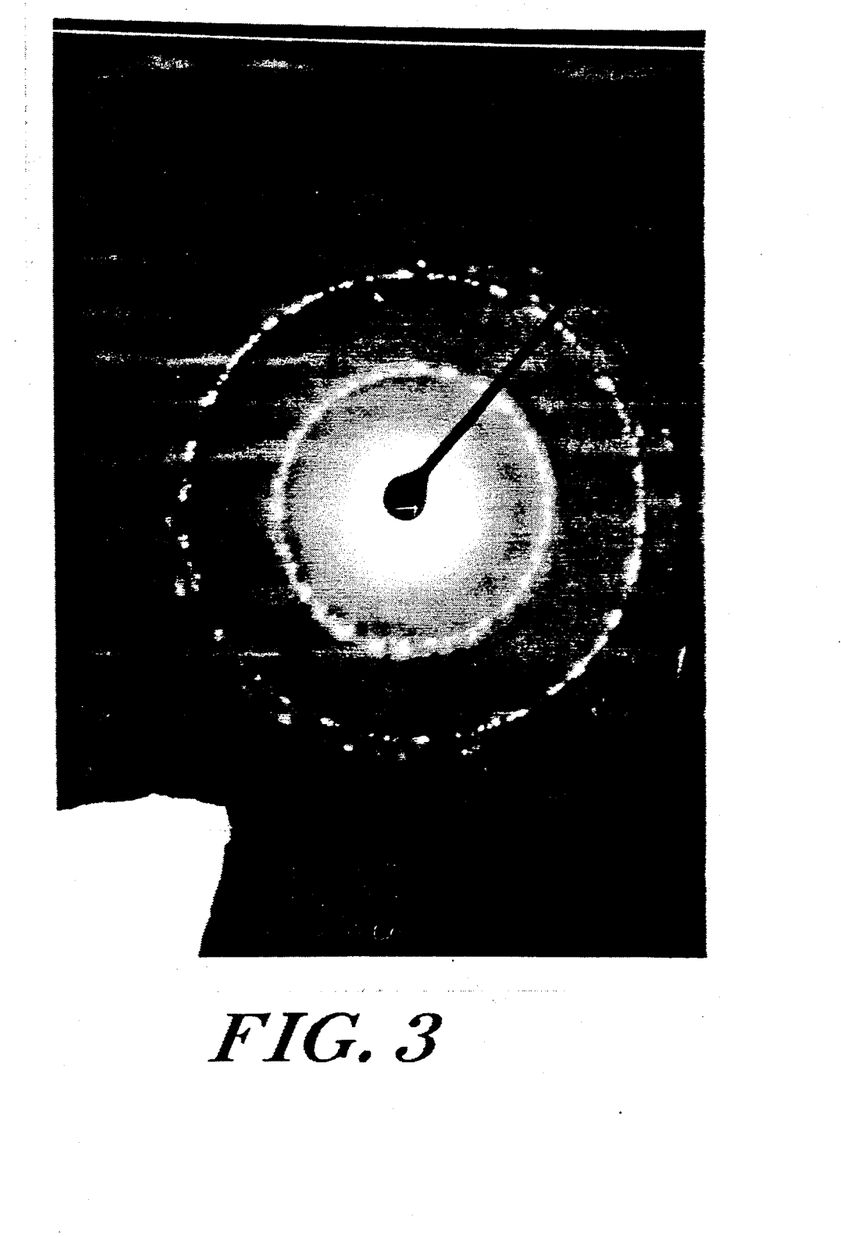
FIG. 3 is an electron diffraction pattern characterizing the crystal structure of a tetrahedrally coordinated boron nitride thin film prepared according to the method of the invention.

Films produced by sputtering in pure argon at 2-10 mTorr exhibit the following properties. First, the boron nitride is tetrahedrally coordinated with cubic, wurtzite, or a mixture of cubic and wurtzite structure. Films of thickness on the order of 1 micron have a yellowish appearance. Thicker films have an amber color. An electron diffraction pattern characterizing the crystal structure of a film sputtered in pure argon is shown in FIG. 3. This pattern is consistent with the wurtzite structure. The films are hard and have been measured to withstand 3500 kg/mm$^2$ using microhardness techniques. This number is only a guide, however, since the less hard substrate used in microhardness testing is deformed during the testing. The films exhibit an optical gap of about 4.5 eV. Finally, the films are stable under atmospheric conditions and adhere extremely well to a variety of substrates, for example, quartz, silicon, stainless steel, molybdenum, alumina, tungsten carbide sintered with cobalt as binder, tungsten carbide-cobalt coated with titanium nitride, silicon nitride ceramic, and ceramics made of appropriate mixtures of silicon nitride and alumina.

The concentration of nitrogen vacancies was determined from Auger electron spectroscopy analysis. It was found that the ratio of the atomic concentrations of boron/nitrogen for films produced in pure argon is about 1.2-1.4. If this difference in atomic concentration is due solely to nitrogen vacancies, then the vacancy concentration is approximately 15-30%. The yellowish color observed in such films can be attributed to these defects. The nitrogen vacancies also explain the optical gap of 4.5 eV, which is lower than the value for completely stoichiometric tetrahedrally coordinated boron nitride.

Boron nitride films produced in up to 10 volume volume % nitrogen in argon and nitrogen discharge maintain the tetrahedral structure. For such films, the ratio of boron/nitrogen was found to be about 1.1-1.2. Thus, the tetrahedral structure is stabilized when the nitrogen vacancy concentration in the boron nitride films is greater than 10%. As discussed above, any other defect or combination of defects having a greater energy of formation in the graphitic form than in the tetrahedral forms will lead to a similar result. In particular, when more than one type of defect is incorporated in the boron nitride, it is to be expected that stabilization of the tetrahedral structure can still be achieved when the concentration of each type of defect is less than 10% as long as the combination of concentrations is greater than about 10%.

The defects of tetrahedral boron nitride which result using the methods the invention are an advantage in many applications. This is because the defects increase the toughness of the material by pinning dislocations in the crystal structure and stopping cracks before they spread.

Figure 4:
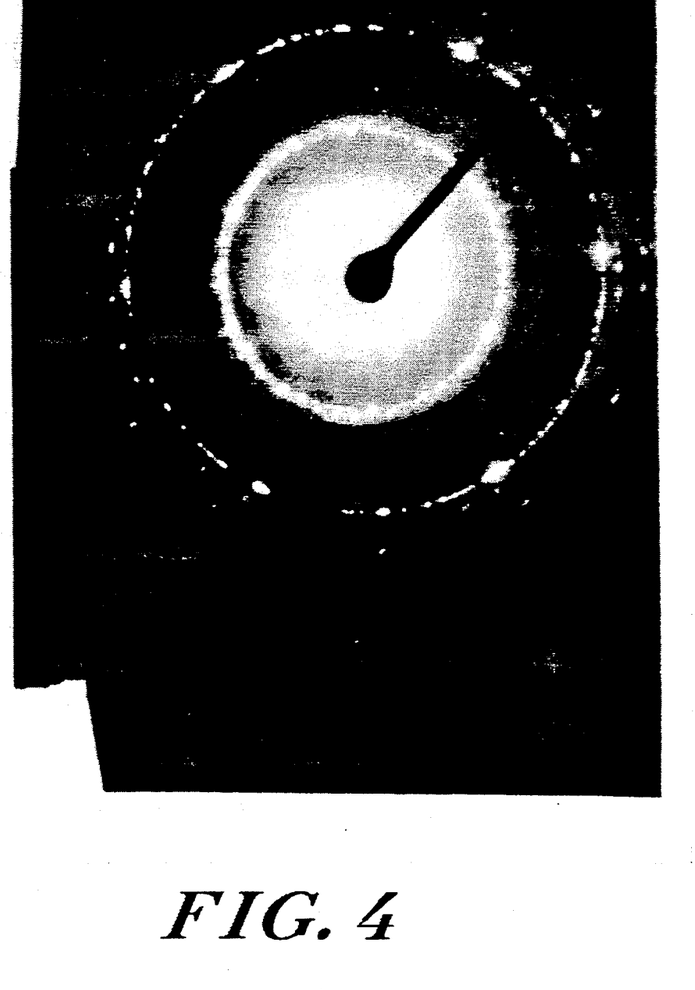
FIG. 4 is an electron diffraction pattern characterizing the crystal structure of a graphitic boron nitride thin film prepared according to the method of the invention.
Figure 5:
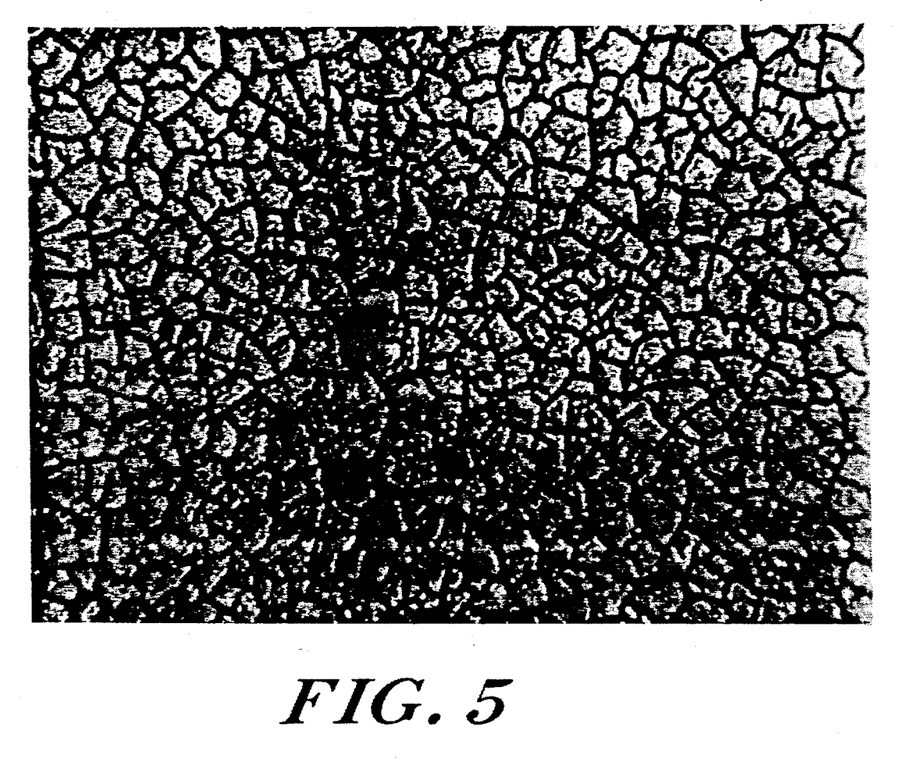
FIG. 5 is a micrograph showing the morphology of a graphitic boron nitride thin film prepared according to the method of the invention exhibiting crazing.

Films produced by sputtering in an atmosphere of argon at 2-10 mTorr with a nitrogen partial pressure of 1-5 mTorr exhibit the following properties. First, the structure is graphitic and therefore soft. The films are completely transparent and have an optical gap of 6.0 eV. An electron diffraction pattern showing the graphitic crystal structure of a film sputtered in a mixed inert gas/nitrogen gas atmosphere is shown in FIG. 4. The films are not stable under atmospheric conditions. Cracks have been observed to develop in specimens on humid days. The degree of instability depends on the film thickness. Very thin films (less than 2000 Å) have maintained a smooth appearance for 3 years. A micrograph showing the morphology of a graphitic boron nitride thin film which has undergone crazing is shown in FIG. 5.

The instability of the graphitic structure can be attributed to the manner in which it grows on the substrate. The graphitic structure only bonds to the substrate with its basal planes perpendicular to the substrate. Thus, the weak bonds between the basal planes are exposed. Humidity and atmospheric impurities tend to penetrate the film at the locations of the weak bonds to cause the observed crazing. As a consequence, these films have a hazy appearance and lubricant properties.

The substrate temperature was found to affect crystallization and stability. Films grown at ambient temperature are partially amorphous. The graphitic forms tend to degrade over a period of a few days. The tetrahedral forms tend to degrade over a period of several months. Films grown at high temperatures (400°-600° C.) tend to degrade only when they have the graphitic structure. Films having the tetrahedral structure have shown no evidence of degradation over a period of 6 years. This is presumeably due to the increased mobility of the atoms at increased temperatures, which leads to the formation of better crystallographic structure during the fabrication process. This also leads to better adherance to the substrate since the atoms can move on the substrate and find an optimum position before bonding.

Substrate bias was found to improve adhesion onto a variety of substrates. If a negative potential is applied to the substrate, some argon ions will hit the substrate rather than the target. This densifies the material by sputtering off loosely adhered material from the substrate which improves crystallization and adhesion to the substrate. In particular, bias sputtering can be used to sputter off graphitic structure and create a more pure tetrahedral structure. Bias sputtering can be achieved, for example, by putting 10-20% of the RF power from the target to the substrate. In fact, the same power source can be used. Experiments showed that a negative substrate potential of magnitude 100-400 volts was appropriate. Self induced bias sputtering can be achieved by lowering the argon pressure which increases the mean free path of the electrons. Experiments showed that argon pressures of 1-2 mTorr induced negative substrate potentials of magnitudes of greater than 100 volts.

Figure 6:
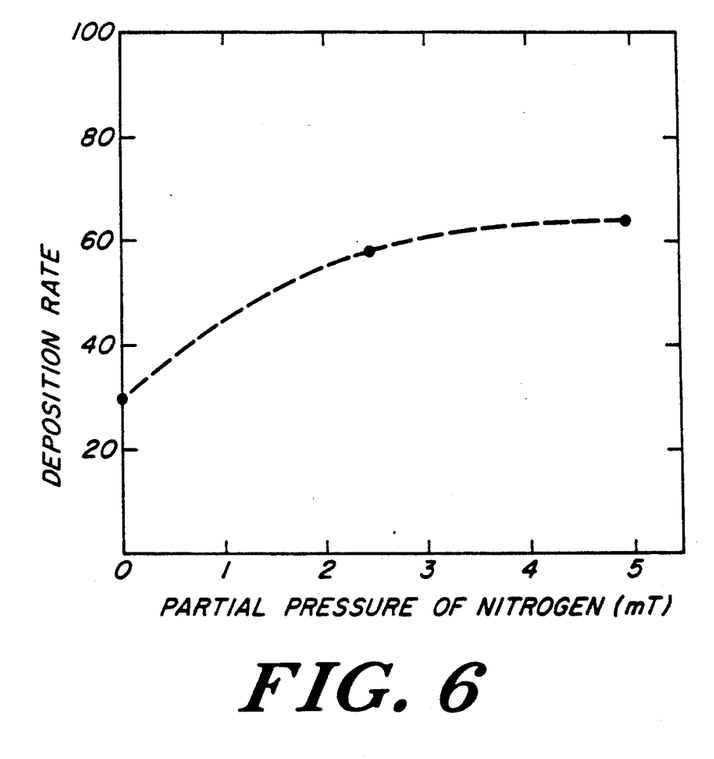
FIG. 6 is a graph showing the growth rate of boron nitride thin films as function of the partial pressure of nitrogen.

Experimental results have shown that the deposition rate of films, determined from the thickness of the film divided by the deposition time, increases with the partial pressure of nitrogen by a factor of 1.6 at 50% nitrogen and falls slightly at 100% nitrogen. The experimental results are presented in FIG. 6. Based on the experience of reactive sputtering, one would have expected the opposite result. Reactive gases, in general, carry a significant fraction of the discharge current but contribute very little to the sputtering rate. The observed increase in deposition rate can be attributed not to a higher sputtering yield, but to the increase of the thickness of the film due to the structural transformation of the boron nitride films from the tetrathedral to the graphitic phase as the partial pressure of nitrogen increases. The mass densities of the two structures are 3.5 gm/cm$^3$ for the tetrahedral structure and 2.2 gm/cm$^3$ for the graphitic structure, in approximate agreement with the observed increase in deposition rate.

An important application of tetrahedral boron nitride grown using the methods of the invention is tool hardening (borehole tools, for example). Tetrahedral boron nitride has advantages over diamond for such applications because carbon from diamond dissolves into iron and becomes graphite. Tetrahedral boron nitride does not exhibit this effect. Tetrahedral boron nitride deposited according to the methods of the invention also has advantages over stoichiometric boron nitride because of its increased toughness.

Since the tetrahedral films can be deposited at room temperature, they can be used to coat substrates like plastics, glass, fibers, etc. Such coating would improve the wear properties of the substrate and also should improve the permeability to atmospheric impurities. The graphitic films deposited according to the invention can be used as anti-friction layers in a variety of applications.

Modification and variations of the invention will occur to those skilled in the art, and it is intended that all such modifications and variations be within the scope of the claims.

What is claimed is:

1. A method for depositing a nitrogen-deficient, tetrahedrally coordinated boron nitride on a substrate, comprising the steps of:

generating a boron species and a nitrogen species by sputtering a boron and nitrogen containing target in an inert gas atmosphere containing no more than ten volume percent nitrogen;

generating a flux of the boron species and a flux of the nitrogen species towards the substrate, the ratio of nitrogen flux to boron flux being less than or equal to one, under conditions sufficient to deposit a nitrogen-deficient, tetrahedrally coordinated boron nitride on the substrate.

2. The method of claim 1, further comprising the step of:

introducing a substitutional dopant during generation of the boron and nitrogen species under conditions sufficient to deposit a substitutionally-doped, nitrogen-deficient, tetrahedrally-coordinated boron nitride on the substrate.

3. The method of claim 2, wherein the step of introducing a substitutional dopant comprises a substitutional dopant selected from a group consisting of Group IVA, Group IIA, and Group VIA elements.

4. The method of claim 1, wherein the step of depositing a nitrogen-deficient boron nitride comprises depositing a composition of $BN_{1-x}$, where x is in the range of 0.1 to 0.4.

5. The method of claim 1 or 2, wherein the tetrahedrally coordinated boron nitride is selected from a group consisting of cubic boron nitride, wurtzitic boron nitride, and mixtures thereof.

6. The method of claim 1 or 2, wherein said sputtering comprises radio frequency sputtering.

7. The method of claim 1 or 2, wherein the deposition onto the substrate occurs at a temperature in the range of 400° C. to 600° C.

8. The method of claim 1 or 2, wherein the step of generating a boron and nitrogen species comprises sputtering a boron and nitrogen containing target in an inert gas atmosphere containing no nitrogen.

9. The method of claim 1 or 2, wherein the substrate is biased.

10. The method of claim 9, wherein the bias is an RF bias.

11. The method of claim 10, wherein the bias is in the range of $-100$ to $-400$ volts.

12. The method of claim 9, wherein the bias is self-induced.

* * * * *

UNITED STATES PATENT AND TRADEMARK OFFICE
CERTIFICATE OF CORRECTION

PATENT NO. : 5,296,119
DATED : March 22, 1994
INVENTOR(S) : Theodore D. Moustakas It is certified that error appears in the above-indentified patent and that said Letters Patent is hereby corrected as shown below:

Column 1, line 54: delete "tetrahedral" and insert therefor --tetrahedrally--.

Column 4, line 7: delte "produce" and insert therefor --produced--.

Column 5, line 49: after "10" please delete "volume".

Signed and Sealed this

Twentieth Day of September, 1994

Attest:

BRUCE LEHMAN

Attesting Officer     Commissioner of Patents and Trademarks